(12) United States Patent
Nandakumar et al.

(10) Patent No.: US 6,617,217 B2
(45) Date of Patent: Sep. 9, 2003

(54) REDUCTION IN WELL IMPLANT CHANNELING AND RESULTING LATCHUP CHARACTERISTICS IN SHALLOW TRENCH ISOLATION BY IMPLANTING WELLS THROUGH NITRIDE

(75) Inventors: Mahalingam Nandakumar, Plano, TX (US); Dixit Kapila, Plano, TX (US); Seetharaman Sridhar, Irving, TX (US)

(73) Assignee: Texas Instruments Incorpated, Dallas, TX (US)

( * ) Notice: Subject to any disclaimer, the term of this patent is extended or adjusted under 35 U.S.C. 154(b) by 0 days.

(21) Appl. No.: 09/967,067

(22) Filed: Sep. 28, 2001

(65) Prior Publication Data

US 2002/0042184 A1 Apr. 11, 2002

Related U.S. Application Data

(60) Provisional application No. 60/239,209, filed on Oct. 10, 2000.

(51) Int. Cl.[7] ............................................. H01L 21/336
(52) U.S. Cl. ..................... 438/298; 438/231; 438/419
(58) Field of Search ................................. 438/142, 180, 438/181, 185, 194, 229, 231, 232, 289, 298, 299, 320, 369, 364, 419, 420

(56) References Cited

U.S. PATENT DOCUMENTS

| | | | | |
|---|---|---|---|---|
| 5,393,679 A | * | 2/1995 | Yang | 437/34 |
| 5,429,958 A | * | 7/1995 | Matlock | 437/34 |
| 5,688,710 A | * | 11/1997 | Lu | 437/57 |
| 6,060,358 A | * | 5/2000 | Bracchitta et al. | 438/259 |
| 6,268,637 B1 | * | 7/2001 | Gardner et al. | 257/522 |
| 6,444,554 B1 | * | 9/2002 | Adachi et al. | 438/587 |

* cited by examiner

*Primary Examiner*—Amir Zarabian
*Assistant Examiner*—Pamela E Perkins
(74) *Attorney, Agent, or Firm*—Peter K. McLarty; W. James Brady, III; Frederick J. Telecky, Jr.

(57) ABSTRACT

Retrograde wells are formed by implanting through nitride films (40). Nitride films (40) are formed after STI (20) formation. By selectively masking a portion of the wafer with photoresist (47) after portions of a retrograde well are formed (45, 50, 55, and 60) the channeling of the subsequent zero degree implants is reduced.

15 Claims, 3 Drawing Sheets

REDUCTION IN WELL IMPLANT CHANNELING AND RESULTING LATCHUP CHARACTERISTICS IN SHALLOW TRENCH ISOLATION BY IMPLANTING WELLS THROUGH NITRIDE

This application claims priority under 35 USC §119(e)(1) of provisional application Ser. No. 60/239,209, filed Oct. 10, 2000.

FIELD OF THE INVENTION

The invention is generally related to the field of semiconductor device fabrication and more specifically to a method for reducing channeling and latchup in shallow trench isolation structures by implanting through nitride.

BACKGROUND OF THE INVENTION

In current VLSI technology for fabricating submicron CMOS integrated circuits, high energy ion implantation is used for making retrograde wells. In retrograde wells the carrier concentration deep in the silicon substrate is greater than the carrier concentration at the surface. In general, retrograde wells are useful for the following reasons: their ability to put high concentration of dopants at specific desired locations, their low thermal budget (no high thermal budget well formation required), their reduced cost and processing complexity by having all the channel implants done at the same mask level, and their improvement in soft-error immunity. The high energy (MeV) implants require some changes in the processing steps compared to the non-MeV implant processing. The MeV implant requires photoresist that is a couple of microns thick to prevent the ions from penetrating it in the masked-off regions. For such thick photoresist, the channel implants need to be done at zero degrees. At any other angle, the implant will shadowed in the device region which could lead to a reduction in device performance and/or device failure. Shadowing also causes the well implant to be shifted laterally from its zero degree implant position. Implants done at zero degrees in (100) silicon result in channeling. At other angles, the implants will be dechanneled depending on the tilt angle of the implant. The dechanneled dopant profiles differ from the channeled implants in the tail region of the profile. In case of a boron channeled implant, there is a prominent second peak; for a completely dechanneled boron implant, the peak is small or absent. In the case of phosphorus channeled implant, there is a long tail; for a completely dechanneled phosphorus implant, the tail is very small or absent. Since the total implanted dose is the same in all implants, the nonchanneled implants will have higher peak concentrations compared to the channeled implants. Thus, the net effect of increasing the implant tilt angle is to cause the well doping profiles to be shifted laterally, decrease the dopant channeling tail, and increase dopant peak concentration.

Given the current feature sizes of shallow trench isolation (STI) structures, it is necessary to use zero degree high energy implants to form the retrograde well structures. For zero degree high energy implants, the center of the silicon wafer or substrate has channeling implants, and the left and right edges have nonchanneling implants. This causes a variation in the punch through voltage, leakage current, and latchup characteristics of transistors fabricated in these substrates. In general, this variation in transistor characteristics occurs in both 6-in and 8-in wafers with the effect being more pronounced in the larger wafers.

As the feature size of the transistors decrease, the spacing between transistors will also decrease. This reduction in spacing is accomplished by reducing the feature size of the STI structures. As the STI feature size is reduced, the effect on the transistor characteristics of channeling during retrograde well formation will become more pronounced. This channeling could eventually lead to complete failure of the integrated circuit. There is therefore a great need for a method of formation of retrograde wells with reduced dopant channeling.

SUMMARY OF THE INVENTION

The instant invention is a method of forming retrograde wells in silicon integrated circuit fabrication with reduced channeling effects. The method comprises forming silicon nitride films on the surface of the wafer after the formation of the isolation structures. By performing the retrograde well implants through these silicon nitride layers, channeling is reduced.

DETAILED DESCRIPTION OF THE INVENTION

Figure 1A:
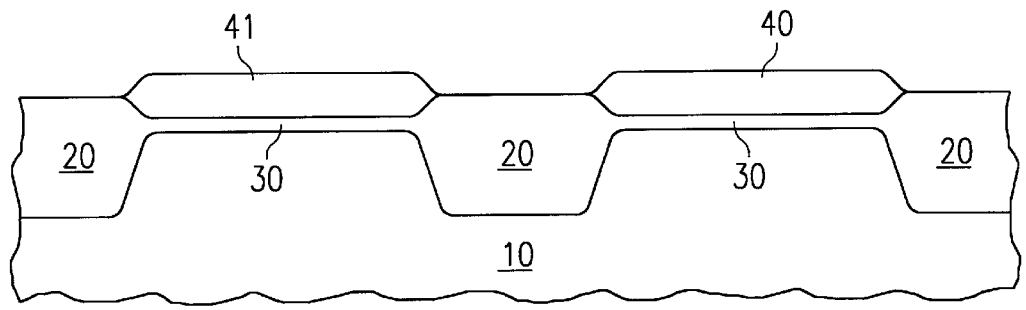
FIGS. 1A–1E are cross-sectional diagrams illustrating an embodiment of the instant invention

A silicon substrate 10 may be single-crystal silicon or an epitaxial silicon layer formed on a single crystal substrate as shown in FIG. 1A. Shallow trench isolation structures 20, pad oxide structures 30, and silicon nitride structures 40, 41 are formed in the substrate 10 using standard processing techniques. In an embodiment of the instant invention, the pad oxide 30 is formed by thermally growing or depositing a film of silicon oxide. A silicon nitride film is formed on the pad oxide film and the structure is patterned and etched to form the isolation trench structures. The trenches are filled with a dielectric material, usually silicon dioxide, to form the STI structures 20. The structure shown in FIG. 1A is formed after chemical mechanical polishing (CMP) is used to remove excess silicon dioxide material which was formed during the trench filling process.

Figure 1B:
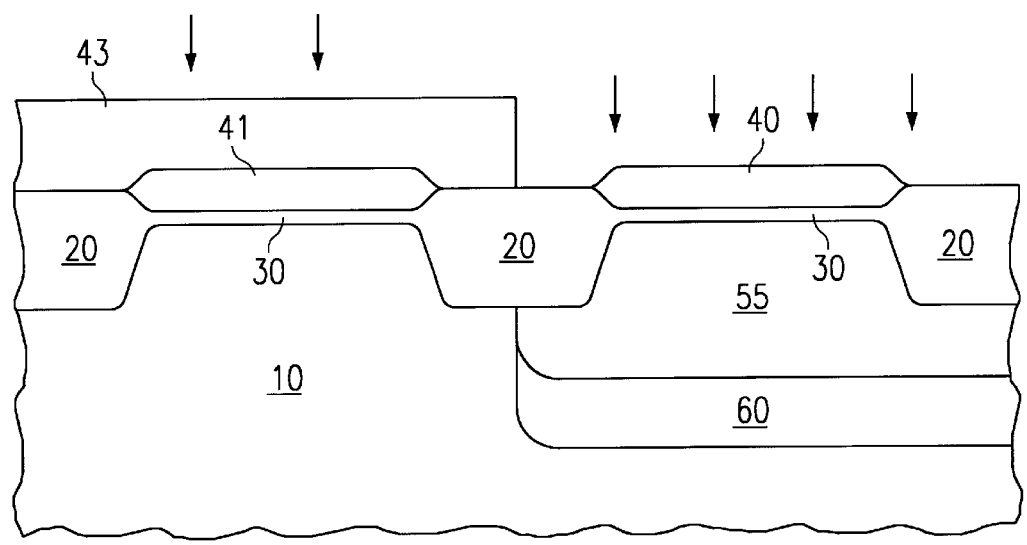
Figure 1C:
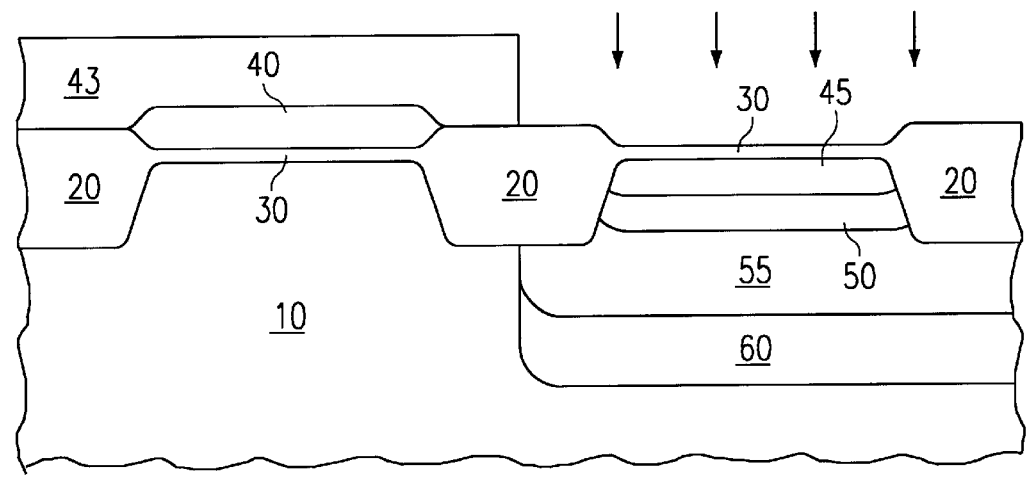

As shown in FIG. 1B, a photoresist film 43 is formed and patterned on the structure of FIG. 1A to expose the area where the first well structure will be formed. The photoresist film must be thick enough not to be penetrated by the implanted ion species. In the case of an n-well, a n-type dopant is implanted through the exposed nitride structure 41 to form the n-well region 60. In one embodiment of the instant invention the implant used to form the n-well region comprises a phosphorous implant with a dose of $2\times10^{12}$ cm$^{-2}$–$6\times10^{12}$ cm$^{-2}$ with energies of 300 KeV–500 KeV. The p-channel channel stop implants comprise a n-type dopant and are also performed through the exposed nitride structure 41 to form region 55 in FIG. 1B. In an embodiment of the instant invention, the p-channel stop implant comprises a phosphorous implant with a dose of $2\times10^{12}$ cm$^{-2}$–$6\times10^{12}$ cm$^{-2}$ with energies of 100 KeV–500 KeV. Forming the N-well region 60 and the P-channel stop region 55 by implanting through the nitride region 41 reduces the channeling of the zero degree implanted species that would otherwise have taken place. Following the formation of the N-well region 60 and the P-channel stop region 55, the nitride region 41 is removed. In an embodiment of the instant invention this is accomplished using a reactive ion etching (RIE) process. The punch through implant and the threshold voltage implant are then performed through the exposed oxide region 30 to form regions 50 and 45 respectively. In an embodiment of the instant invention the punch through implant comprises a phosphorous implant with a dose of $2 \times 10^{12}$ cm$^2$–$6 \times 10^{12}$ cm$^2$ with energies of 100 KeV–300 KeV and the threshold voltage implant comprises a phosphorous implant with a dose of $2 \times 10^{12}$ cm$^2$–$6 \times 10^{12}$ cm$^2$ with energies of 20 KeV–80 KeV. The regions 45, 50, 55, and 60 which are formed using different implant conditions represent regions of various dopant concentrations.

Figure 1D:
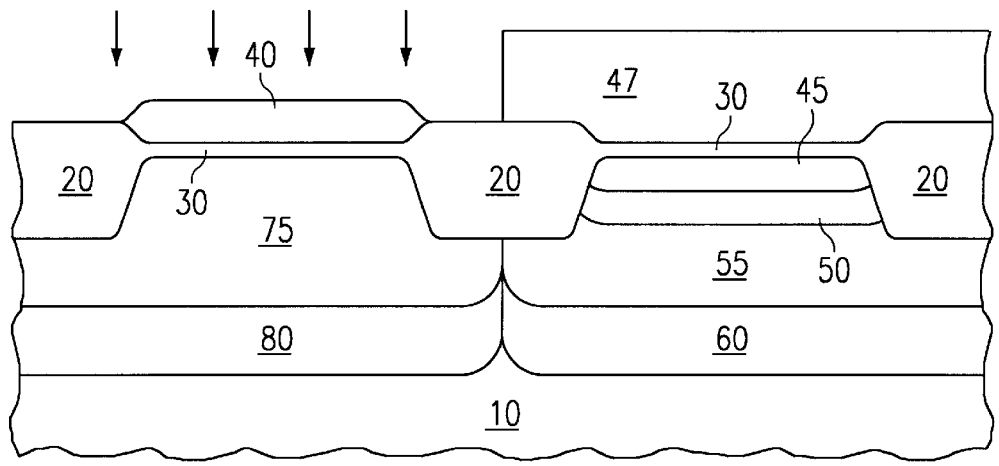
Figure 1E:
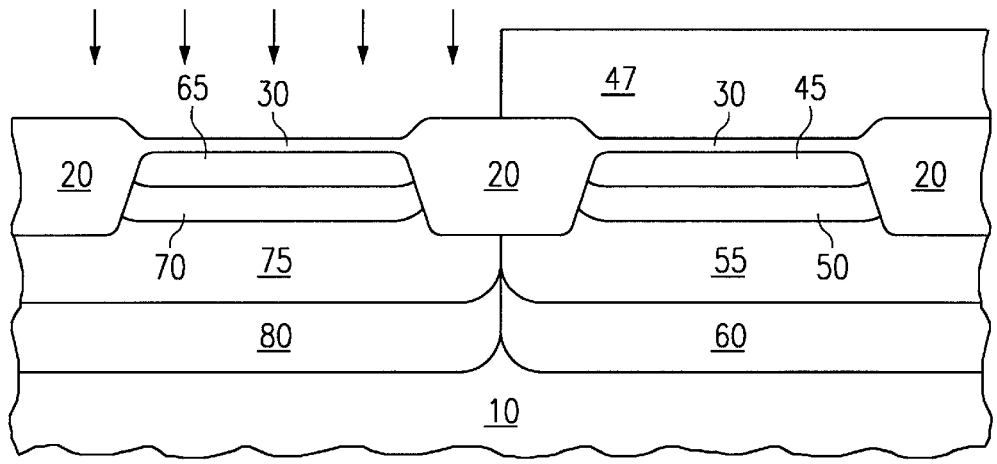

Following the above described implants, the resist film 43 is removed and a new resist film is formed and patterned forming the resist structure 47 illustrated in FIG. 1D. The P-well implant and the N-channel stop implant are performed through the exposed nitride structure 40 to form regions 80 and 75 respectively. In an embodiment of the instant invention, the P-well implant comprises a boron implant with a dose of $1 \times 10^{13}$ cm$^2$–$5 \times 10^{13}$ cm$^2$ with energies of 100 KeV–700 KeV and the n-channel stop implant comprises a boron implant with a dose of $3 \times 10^{12}$ cm$^2$–$1 \times 10^{13}$ cm$^2$ with energies of 50 KeV–500 KeV. The nitride structure is then removed and the punch through implant and the threshold voltage implant are performed through the exposed oxide film 30 to form the regions 70 and 65 respectively. In an embodiment of the instant invention the punch through implant comprises a boron implant with a dose of $1 \times 10^{12}$ cm$^2$–$8 \times 10^{12}$ cm$^2$ with energies of 20 KeV–120 KeV and the threshold voltage implant comprises a boron implant with a dose of $10 \times 10^{11}$ cm$^2$–$3 \times 10^{12}$ cm$^2$ with energies of 2 KeV–50 KeV. The regions 65, 70, 75, and 80 which are formed using different implant conditions represent regions of various dopant concentrations. Implant the p-well and the n-channel punch through regions through the nitride structure 40 reduces the channeling of the zero degree implants.

Figure 2A:
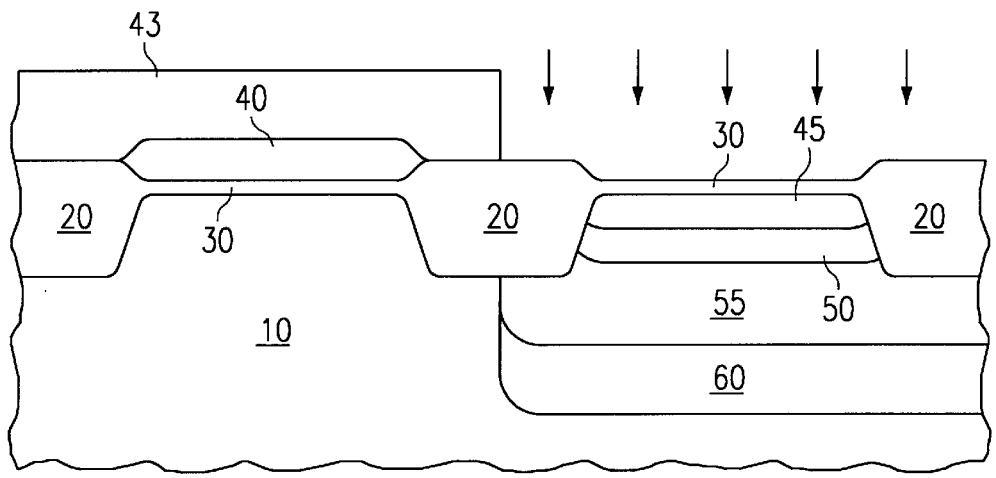
FIGS. 2A–2C are cross-sectional diagrams illustrating a further embodiment of the instant invention.
Figure 2B:
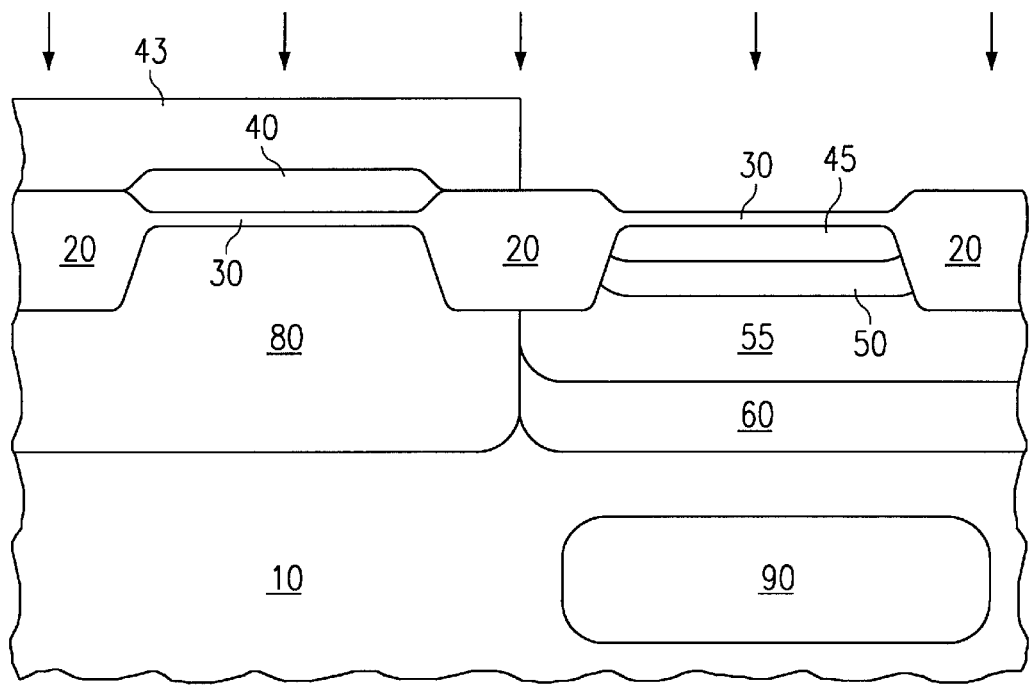
Figure 2C:
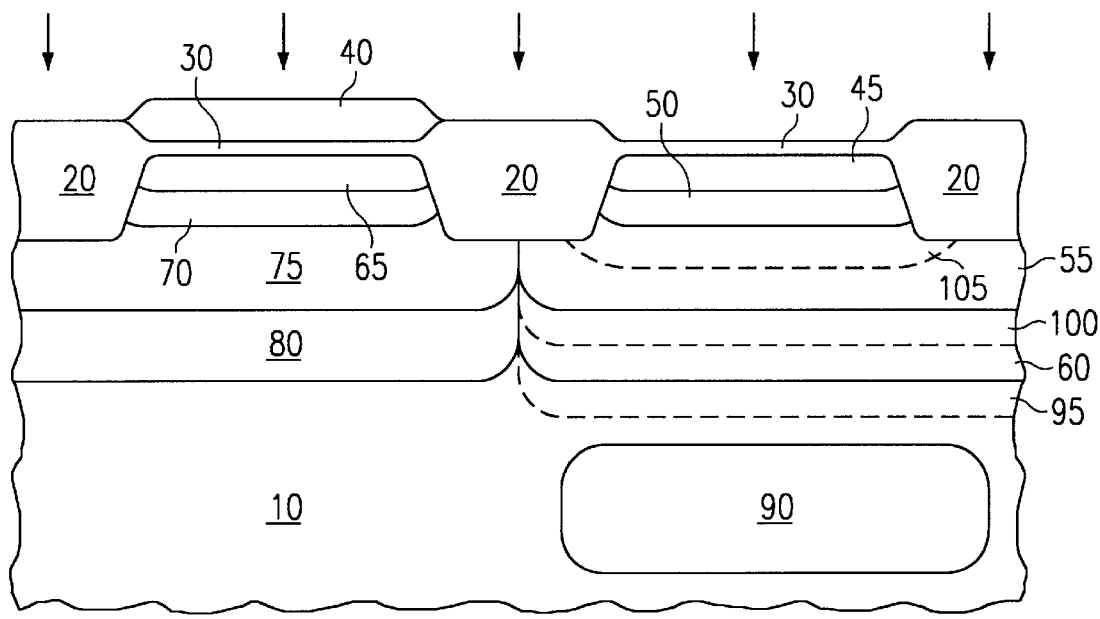

Illustrated in FIGS. 2A–2C is a further embodiment of the instant invention. Shown in FIG. 2A is a silicon substrate 10 with STI structures 20, pad oxide 30, a nitride structure 40, and a photoresist film 43. The n-well region 60, n-channel stop region 55, punch through region 50, and threshold voltage region 45 are formed as described above. Following the formation of regions 45, 50, 55, and 60, the p-well region 80 is formed by implanting a p-type dopant species through the photoresist film 43, nitride structure 40, and pad oxide 30. This p-well region 80 is shown in FIG. 2B. The p-well region 80 formed in this way will have reduced channeling and will be self aligned to the n-well region 60 and the punch through region 55. This implant will also form the p-type region 90. Because of the high implant energy required to penetrate the resist film 43 and the nitride structure 40, region 90 will be positioned below the n-well region 60 and will have no effect on the operation of devices fabricated in the n-well region 60. Following formation of the p-well region 80, the photoresist structure 43 is removed and the channel stop, punch through, and threshold voltage implants are performed through the now exposed nitride structure 40. These p-type implants will form regions 75, 70, and 65 respectively. These regions will also be self aligned to regions 60 and 55. In addition by implanting through the nitride structure 40 the channeling of the ions is reduced. These implants will also form regions 95, 100, and 105. These p-type regions will be offset from the n-type regions 60, 55, and 50. The amount of offset will be determined by the implant conditions and the thickness of the nitride structure 40. Since the implanted p-type ions will compensate the n-type regions 60, 55, 50, and 45, it is important that the implant conditions and nitride thickness be such that devices fabricated in the n-well region 60 following all the implants function correctly.

We claim:

1. A method for forming retrograde well structures, comprising:

providing a semiconductor substrate with an upper surface;

forming a pad oxide on said semiconductor surface;

forming a first nitride structure on a first portion of said pad oxide structure;

forming a second nitride structure on a second portion of said pad oxide structure;

forming shallow trench isolation structures in said semiconductor substrate;

forming a photoresist film over said second nitride structure;

implanting a first dopant species through said first nitride structure to form a first well region in said semiconductor substrate; and implanting a second dopant species through said first nitride structure to form a first channel stop region in said semiconductor substrate.

2. The method of claim 1 further comprising:

removing said first nitride structure thereby exposing said first portion of said pad oxide;

implanting a third dopant species through said first portion of said pad oxide to form a first punch through region; and implanting a fourth dopant species through said first portion of said pad oxide to form a first threshold voltage region.

3. The method of claim 1 wherein said first dopant species is selected from the group consisting of phosphorous and arsenic.

4. The method of claim 1 wherein said first dopant species is selected from the group consisting of boron and boron containing compounds.

5. The method of claim 1 wherein said second dopant species is selected from the group consisting of phosphorous and arsenic.

6. The method of claim 1 wherein said second dopant species is selected from the group consisting of boron and boron containing compounds.

7. The method of claim 2 wherein said third dopant species is selected from the group consisting of boron and boron containing compounds.

8. The method of claim 2 wherein said third dopant species is selected from the group consisting of phosphorous and arsenic.

9. The method of claim 2 wherein said fourth dopant species is selected from the group consisting of boron and boron containing compounds.

10. The method of claim 2 wherein said fourth dopant species is selected from the group consisting of phosphorous and arsenic.

11. A method for forming retrograde well structures, comprising:

providing a semiconductor substrate with an upper surface;

forming a pad oxide on said semiconductor surface;

forming a first nitride structure on a first portion of said pad oxide structure;

forming a second nitride structure on a second portion of said pad oxide structure;

forming shallow trench isolation structures in said semiconductor substrate;

forming a photoresist film over said second nitride structure;

implanting a first dopant species through said first nitride structure to form a first well region in said semiconductor substrate;

implanting a second dopant species through said first nitride structure to form a first channel stop region in said semiconductor substrate;

removing said first nitride structure thereby exposing said first portion of said pad oxide;

implanting a third dopant species through said first portion of said pad oxide to form a first punch through region; and implanting a fourth dopant species through said first portion of said pad oxide to form a first threshold voltage region.

12. The method of claim 11 wherein said first dopant species is selected from the group consisting of phosphorous, arsenic, boron, and boron containing compounds.

13. The method of claim 11 wherein said second dopant species is selected from the group consisting of phosphorous, arsenic, boron, and boron containing compounds.

14. The method of claim 11 wherein said third dopant species is selected from the group consisting of phosphorous, arsenic, boron, and boron containing compounds.

15. The method of claim 11 wherein said fourth dopant species is selected from the group consisting of phosphorous, arsenic, boron, and boron containing compounds.

* * * * *